US011342318B2

(12) United States Patent
Ito et al.

(10) Patent No.: US 11,342,318 B2
(45) Date of Patent: May 24, 2022

(54) OPTICAL COMMUNICATION APPARATUS

(71) Applicant: Nippon Telegraph and Telephone Corporation, Tokyo (JP)

(72) Inventors: Toshihiro Ito, Musashino (JP); Kotaro Takeda, Musashino (JP)

(73) Assignee: NIPPON TELEGRAPH AND TELEPHONE CORPORATION, Tokyo (JP)

( * ) Notice: Subject to any disclaimer, the term of this patent is extended or adjusted under 35 U.S.C. 154(b) by 20 days.

(21) Appl. No.: 17/057,590

(22) PCT Filed: May 15, 2019

(86) PCT No.: PCT/JP2019/019320
§ 371 (c)(1),
(2) Date: Nov. 20, 2020

(87) PCT Pub. No.: WO2019/225440
PCT Pub. Date: Nov. 28, 2019

(65) Prior Publication Data
US 2021/0193638 A1    Jun. 24, 2021

(30) Foreign Application Priority Data

May 21, 2018    (JP) .............................. JP2018-097463

(51) Int. Cl.
*H01L 25/16*    (2006.01)
*H01L 23/00*    (2006.01)
(Continued)

(52) U.S. Cl.
CPC ............ *H01L 25/167* (2013.01); *H01L 24/16* (2013.01); *H03F 3/45475* (2013.01);
(Continued)

(58) Field of Classification Search
CPC ....... H04B 10/40; H01L 25/167; H01L 24/16; H01L 2224/16227; H01L 2924/12043;
(Continued)

(56) References Cited

U.S. PATENT DOCUMENTS

| 11,221,452 B2* | 1/2022 | Papanikolaou ........ G02B 6/425 |
| 2013/0051808 A1* | 2/2013 | Kucharski .............. H03H 11/48 |
| | | 398/135 |

(Continued)

OTHER PUBLICATIONS

International Search Report dated Aug. 13, 2019, issued in PCT Application No. PCT/JP2019/019320, filed May 15, 2019.
(Continued)

*Primary Examiner* — Dalzid E Singh
(74) *Attorney, Agent, or Firm* — Workman Nydegger

(57) ABSTRACT

There is provided an optical communication device capable of minimum suppressing inter-signal interference of inductors mounted to enable a transmission signal to be transmitted and received with a high frequency. The optical communication device comprises a sub-package as a subassembly in each of a plurality of signal channels. The sub-package includes a substrate on which an optical semiconductor and an IC are flip-chip connected. The optical semiconductor includes a pair of photodiodes receiving a differential optical signal and outputting a differential current signal. The IC includes a transimpedance amplifier converting the differential current signal from the optical semiconductor to a voltage signal. The optical semiconductor has a pair of inductors formed for each of the pair of photodiodes and a ground wiring formed so as to surround the formed pair of inductors.

10 Claims, 6 Drawing Sheets

(51) Int. Cl.
*H03F 3/45* (2006.01)
*H04B 10/40* (2013.01)

(52) U.S. Cl.
CPC .... *H04B 10/40* (2013.01); *H01L 2224/16227* (2013.01); *H01L 2924/1206* (2013.01); *H01L 2924/12043* (2013.01); *H01L 2924/1424* (2013.01)

(58) Field of Classification Search
CPC ..... H01L 2924/1206; H01L 2924/1424; H03F 3/45475
USPC .......................................................... 398/136
See application file for complete search history.

(56) References Cited

U.S. PATENT DOCUMENTS

| | | | | |
|---|---|---|---|---|
| 2014/0231628 A1* | 8/2014 | Miyatake | ................... | G01J 1/44 |
| | | | | 250/214 DC |
| 2014/0291487 A1* | 10/2014 | Laforce | ................... | H03F 3/087 |
| | | | | 250/214 LA |
| 2021/0218475 A1* | 7/2021 | Suzuki | ................. | H04B 10/614 |

OTHER PUBLICATIONS

Iku Ogawa et al., 100 Gbit/s Optical Receiving FE Module Technology, NTT Technical Journal, Mar. 2011, pp. 62-66.

* cited by examiner

OPTICAL COMMUNICATION APPARATUS

TECHNICAL FIELD

The present invention relates to an optical communication device.

BACKGROUND ART

Recent years have seen dramatic development of communication technology which requires a continuous increase in communication capacity. In fact, large-capacity communication devices have been required not only for long-distance trunk lines connecting cities located several hundred kilometers or more away from each other, but also for relatively short-distance lines connecting cities or data centers located less than 100 km away from each other.

The large-capacity digital coherent communication technology, which has conventionally been used only for trunk lines, has also now come to be used for the above-mentioned relatively short-distance communication due to its excellent characteristics such as dispersion tolerance and high reception sensitivity. Non-Patent Literature 1 discloses a coherent optical receiver for use in trunk lines.

The communication network is more finely divided toward the end. Thus, the number of communication devices used in the short distance lines is much greater than the number of communication devices used in the trunk lines and at the same time, the size reduction and cost requirements for the short-distance communication devices are much more stringent than those for the long-distance communication devices.

Further, recent years have seen higher signal transmission baud rate, which is increasing from 32 Gbaud up to 64 Gbaud. The higher the transmission frequency rate, the more stringent the requirements for the high-frequency characteristics of the parts.

Furthermore, a high-speed transmitting/receiving system including a coherent transmission system requires multi-channel transmission, resulting in inter-channel interference, which is one of the causes of characteristic deterioration. This is generally because the inter-channel interference tends to increase as the baud rate increases. For example, in order to transmit a coherent signal commonly used in a polarization-multiplexed quadrature phase-shift keying (PM-QPSK) system, signal transmission of a total of four channels: in-phase and quadrature-phase components in addition to two polarized waves, is needed. However, in order to obtain sufficient transmission characteristics, signal interference between the channels needs to be suppressed below a certain level.

Further, in the case of a transceiver using silicon photonics devices, the transceiver may be mounted on the same chip. In this case, however, signal interference between the transmitter and the receiver also needs to be sufficiently suppressed. Since the transmitter handles large electric signals and the receiver handles minute electric signals after photoelectric conversion, mutual interference particularly needs be suppressed.

CITATION LIST

Non-Patent Literature

Non-Patent Literature 1: Ikuo Ogawa et al. "100 Gbit/s Optical Receiver FE Module Technology" NTT Technical Journal 2011.3 p. 62

SUMMARY OF THE INVENTION

Technical Problem

FIGS. 1 and 2 are diagrams illustrating a configuration of a coherent optical receiver (optical receiver) according to prior art, FIG. 1 being a circuit diagram, and FIG. 2 being a pattern diagram. As illustrated in FIG. 1, the optical receiver includes an optical circuit (DPOH: dual polarization optical hybrid) 70 combining local light and signal light with appropriate phases, an optical semiconductor 50, and a subassembly having a transimpedance amplifier (TIA)-IC 60. The optical circuit 70 combines local light and signal light with appropriate phases and generates a differential optical signal, causing the signal to be incident on a photodiode (PD) mounted on the optical semiconductor. The photodiode photoelectrically converts the incident differential optical signal and inputs it to the TIA-IC. The optical semiconductor having the PD mounted thereon and the TIA-IC are connected by wire bonding. A ground terminal is formed next to each signal terminal.

In the optical receiver as illustrated in FIG. 1 in which the optical semiconductor 50 and the TIA-IC 60 are connected by wire bonding, there are several problems. Specifically, (1) a problem that the number of terminals is limited because the terminals can be provided only on the outer peripheral portion of the device in order to prevent a too long bonding wire from causing problems such as picking up high frequency noise and displacement due to vibration; and (2) a problem of an increased package size because lead wires and the like for external connection need to be provided because of the difficulty to use a ball grid array (BGA) package that deteriorates heat dissipation characteristics in order to dissipate heat from the back side of the IC through the package with the front side of the IC facing upward.

On the other hand, when the IC itself is mounted on a package in a flip-chip configuration, the heat dissipation from the top surface as the main heat dissipation path as a result of the back surface facing upward reduces the need to dissipate heat from the bottom surface (heat dissipation through the package substrate), which facilitates using a BGA structure advantageous for reducing package size.

However, the IC in a flip-chip configuration eliminates the need of wire bonding, which is likely to deteriorate the band characteristics. In order to suppress the effect of deteriorated band characteristics, it may be considered to extend the band by adding inductors, which increases the region for the signal line by the added inductors, which is likely to cause interference between the channels and transmission and reception.

In view of the problems of the prior art described above, the present invention has been made, and an object of the present invention is to provide an optical communication device capable of suppressing inter-signal interference of inductors mounted to enable a transmission signal to be transmitted and received with a high frequency.

Means for Solving the Problem

In order to solve the above problems, the optical communication device according to a first embodiment of the present invention is an optical communication device comprising a sub-package as a subassembly in each of a plurality of signal channels, the sub-package including a substrate on which an optical semiconductor and an IC are flip-chip connected, the optical semiconductor including a pair of photodiodes receiving a differential optical signal and outputting a differential current signal, the IC including a transimpedance amplifier converting the differential current signal from the optical semiconductor to a voltage signal, wherein the optical semiconductor has a pair of inductors formed for each of the pair of photodiodes and a ground wiring formed so as to surround the formed pair of inductors.

DESCRIPTION OF EMBODIMENTS

Hereinafter, an embodiment of the present invention will be described in detail.

First Embodiment

Figure 1:
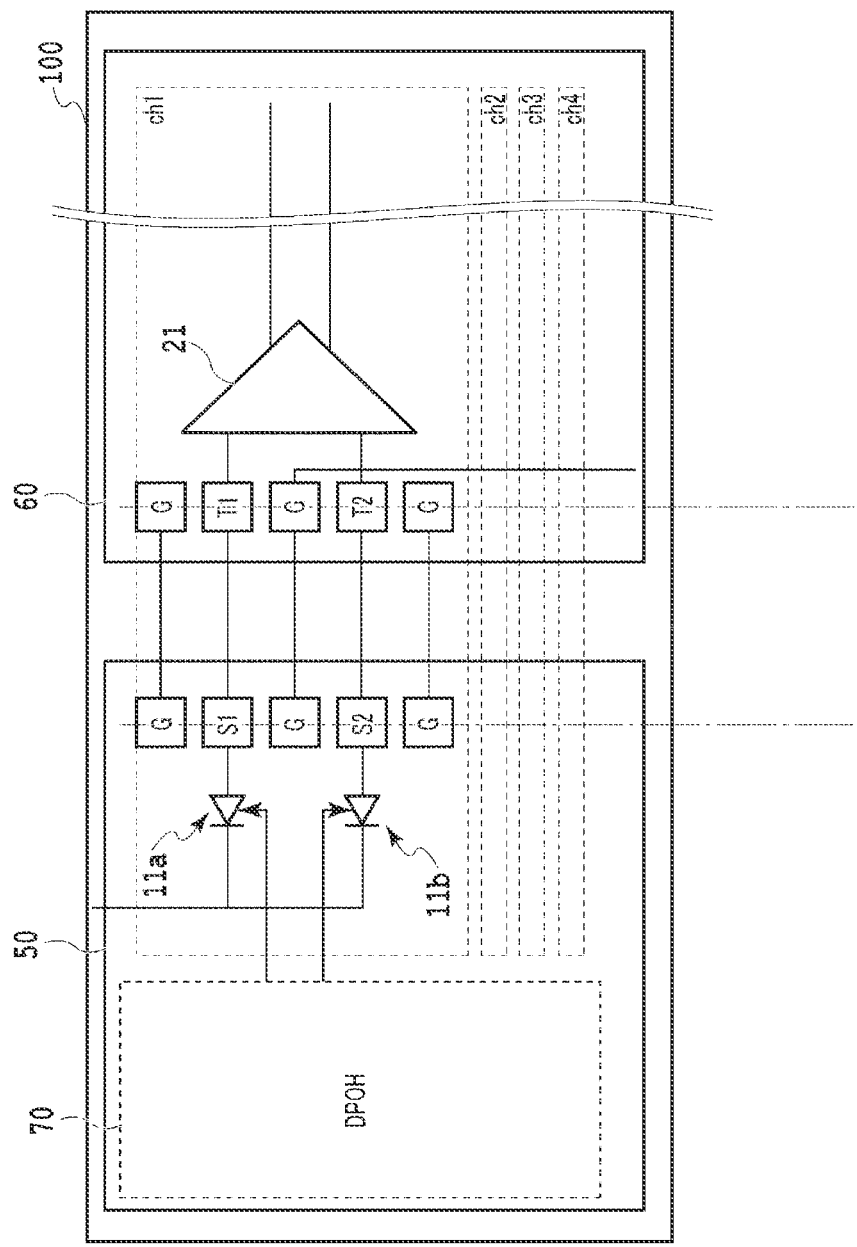
FIG. 1 is a circuit diagram illustrating a configuration of a coherent optical receiver according to prior art.
Figure 2:
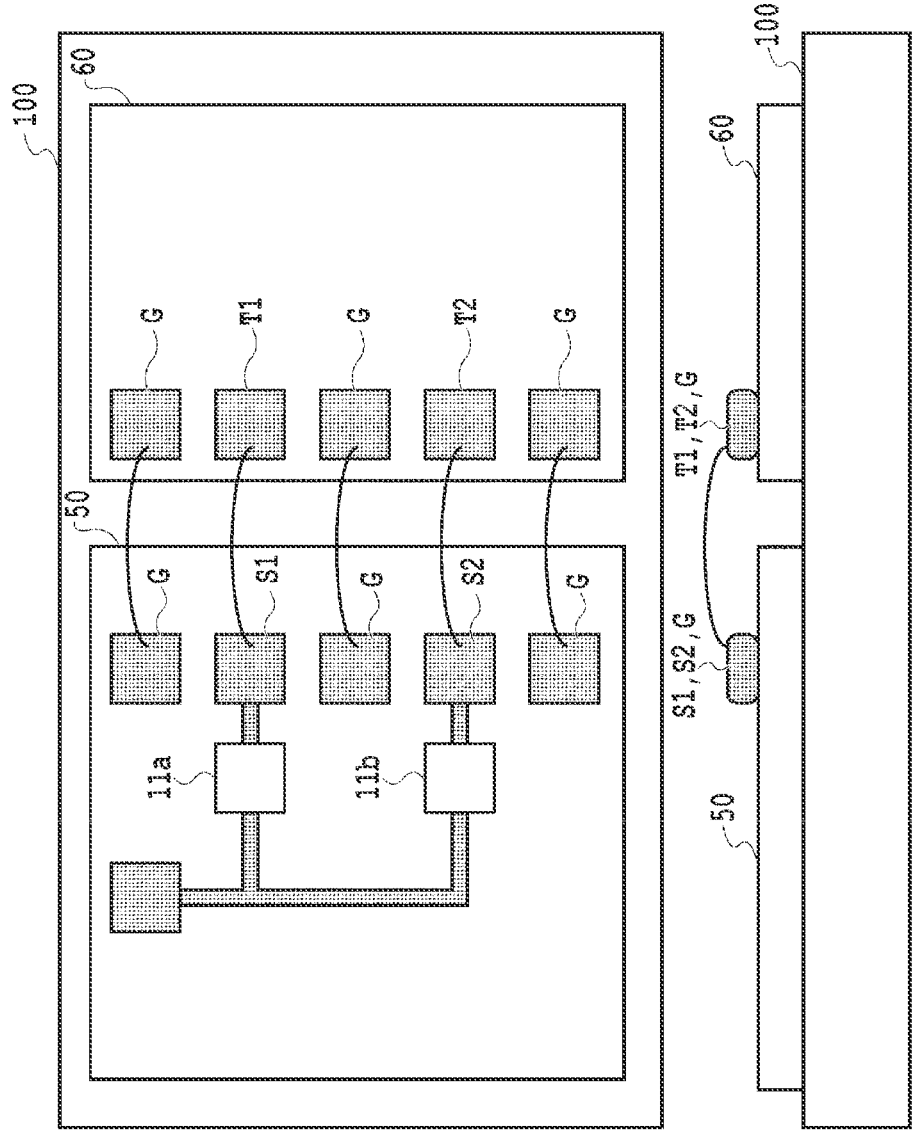
FIG. 2 is a pattern diagram of a pattern illustrating the configuration of the coherent optical receiver according to prior art, (a) being a top view, and (b) being a side view.
Figure 3:
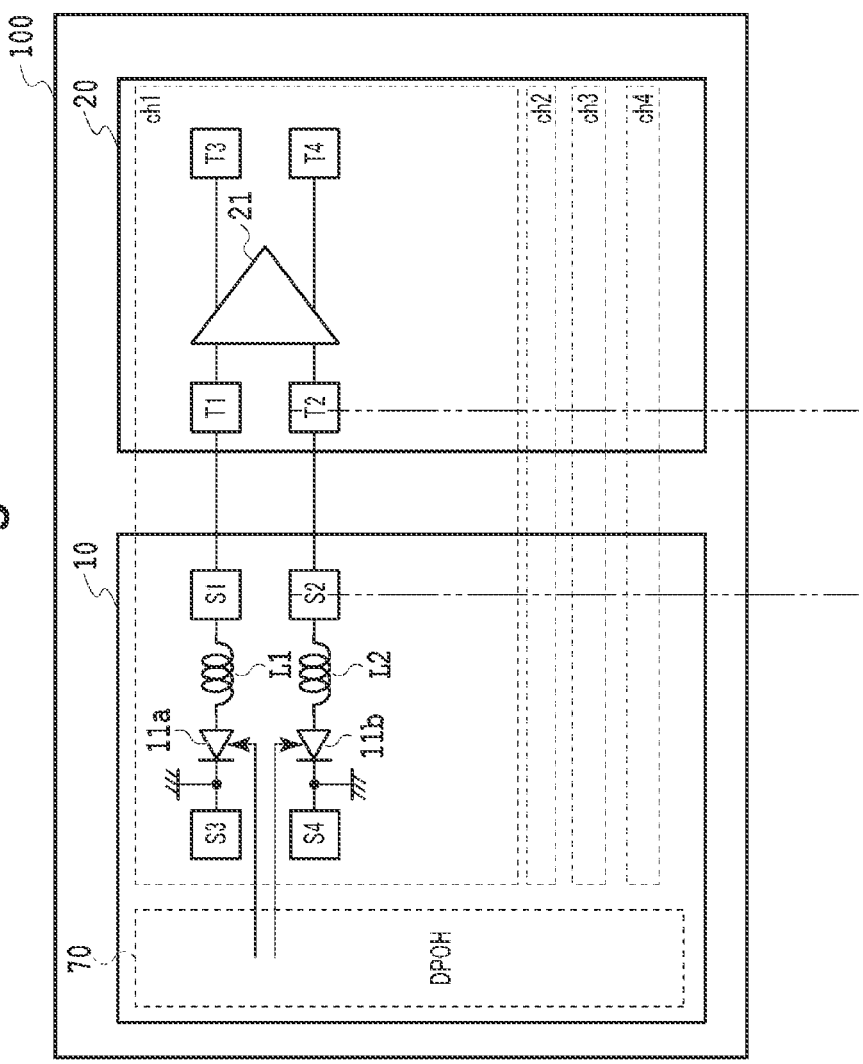
FIG. 3 is a diagram illustrating a circuit diagram of a partial configuration of an optical communication device according to a first embodiment.
Figure 4:
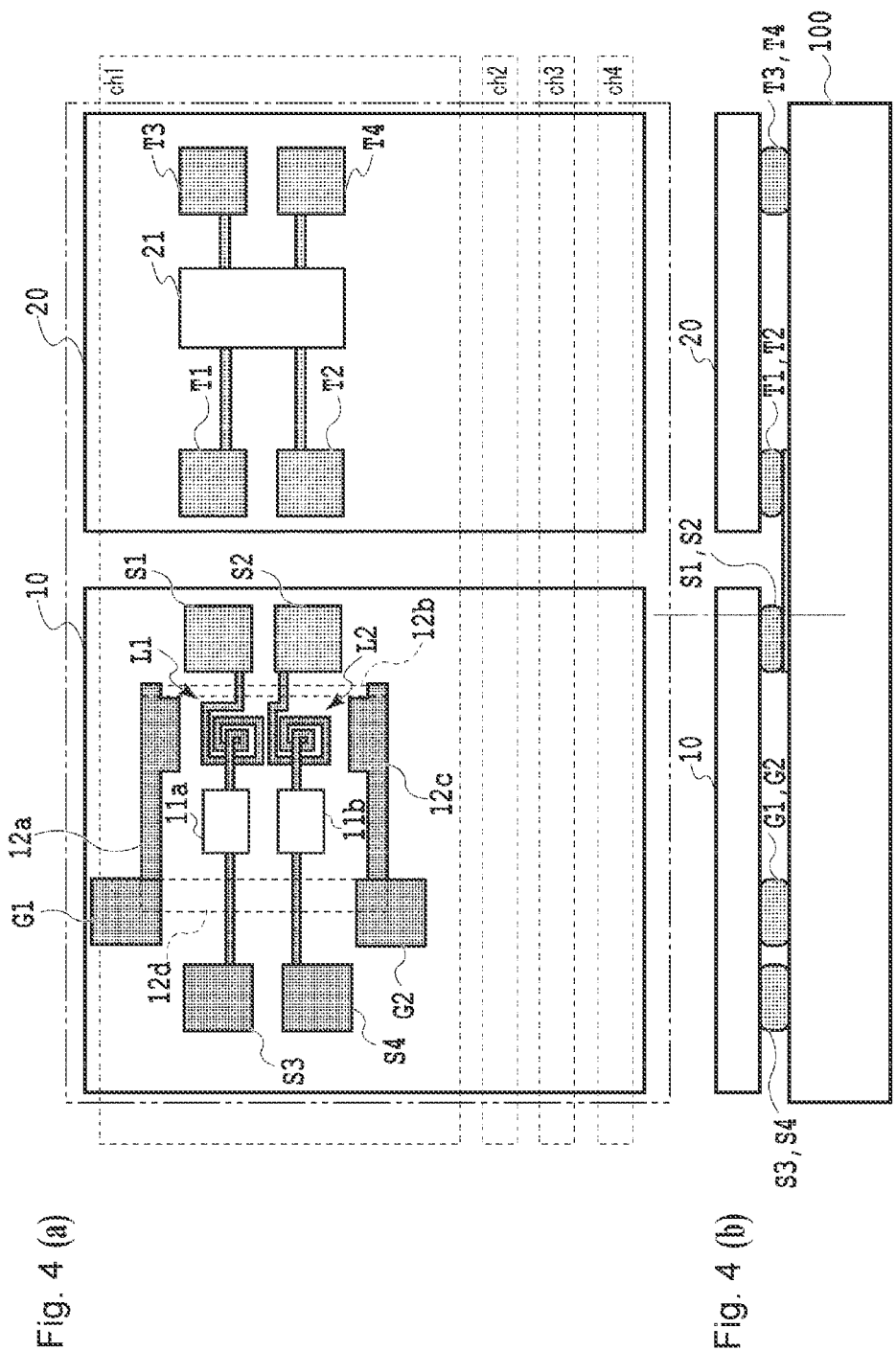
FIG. 4 is a pattern diagram of the partial configuration of the optical communication device according to the first embodiment, (a) being a top view, and (b) being a side view.

FIG. 3 is a diagram illustrating a circuit diagram of a partial configuration of an optical communication device according to a first embodiment. FIG. 4 is a pattern diagram of the partial configuration of the optical communication device. In FIG. 3, (a) is a top view and (b) is a side view. The present embodiment will describe the optical communication device using an example of a coherent optical receiver (also simply referred to as "optical receiver") having an optical device mounted thereon, which may be configured as an optical transceiver. FIGS. 3 and 4 illustrate, as a partial configuration of the optical receiver, the configuration in which only an optical semiconductor 10 and a transimpedance amplifier (TIA)-IC 20 are connected to each other and mounted on a substrate 100 as a sub-package. The optical receiver includes not only the components illustrated in FIGS. 3 and 4 but also an optical circuit (DPOH: dual polarization optical hybrid) (DPOH 70 in FIG. 3) made of planar lightwave circuits (PLCs) and other known modules, but the description thereof is omitted. The examples in FIGS. 3 and 4 illustrate the configuration of only one channel of the four channels. The corresponding circuit diagram and pattern diagram also illustrate the configuration of only one channel. The other three channels may be formed in the same manner. Note that the side view of FIG. 4(b) omits the photodiodes (PDs), wiring patterns, pads (terminals) and the like formed on the lower surface of the drawing. The sub-package on which the optical semiconductor 10 and the TIA-IC 20 are mounted may be a housing made of ceramic or the like instead of the substrate 100 made of silicon or the like.

The optical semiconductor 10 includes a photodiode (PD) 11 as the optical device. Power terminals S3 and S4 are connected to one end of PDs 11a and 11b respectively so as to enable reverse biasing operation. Further, signal terminals S1 and S2 electrically connected to a TIA 21 are connected to the other end of the PDs. Inductors L1 and L2 are provided between the PDs 11a and 11b and the signal terminals S and S2 respectively.

In the present embodiment, each of the inductors L1 and L2 is formed in a spiral shape or a meander shape, and has the same winding direction.

Further, the optical semiconductor 10 includes ground wirings 12a, 12b, 12c, and 12d (also simply referred to as "ground wiring 12") provided so as to surround at least the inductors L1 and L2. The ground wirings 12a, 12b, 12c, and 12d surrounding at least the inductors L1 and L2 are not necessarily required in four directions, but need to be provided at least between adjacent signal channels. The ground terminals G1 and G2 are provided for grounding the ground wirings 12a, 12b, 12c, and 12d. The ground wirings 12a, 12b, 12c, and 12d provided so as to surround at least the inductors L1 and L2 provides a so-called wiring shield, which can suppress signal interference between channels to a minimum. In the pattern illustrated in FIG. 4, the ground wirings 12a and 12c along the wirings of the PDs 11a and 11b can be provided in the same layer as the wiring of the PDs 11a and 11b; and the ground wirings 12b and 12d intersecting the wirings of the PDs 11a and 11b can be provided in a different layer from the wirings of the PDs 11a and 11b.

Figure 5:
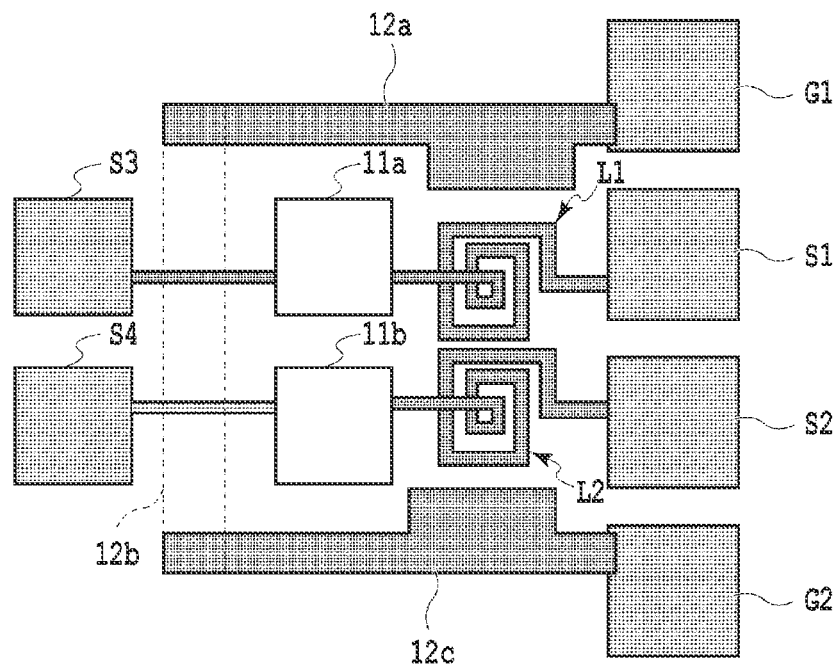
FIG. 5 is a diagram illustrating another configuration example of a pattern of signal/ground wiring and an inductor.
Figure 6:
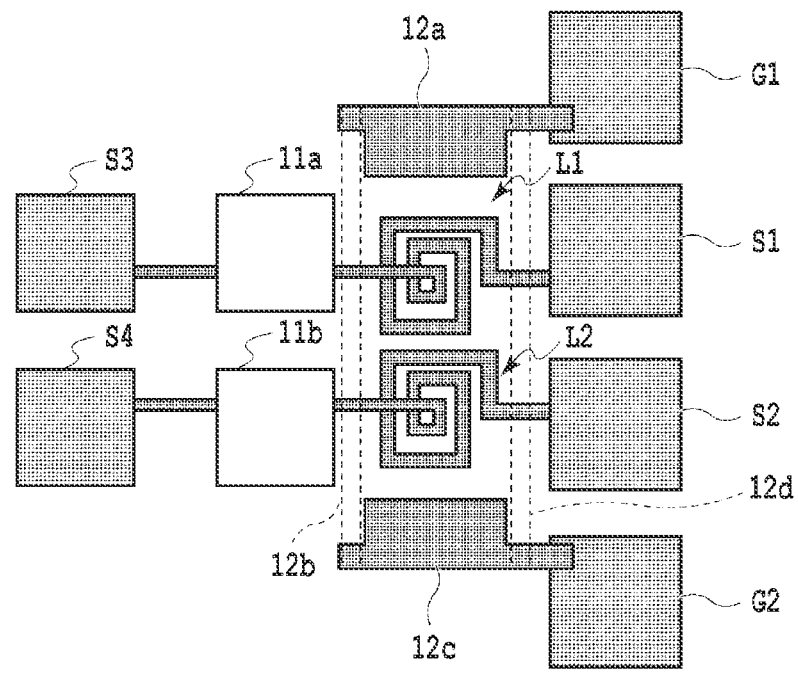
FIG. 6 is a diagram illustrating still another configuration example of a pattern of signal/ground wiring and an inductor.

Here, another configuration example of the pattern of the ground wiring 12 and the inductors will be described. FIGS. 5 to 8 are diagrams illustrating other configuration examples of the pattern of the ground wiring and the inductors. In the example illustrated in FIG. 4, the ground terminals G1 and G2 are disposed near the PDs 11a and 11b, but as illustrated in FIG. 5, the ground terminals G1 and G2 may be disposed in alignment with the signal lead terminals S1 and S2. Further, as illustrated in FIG. 6, the ground wiring 12 may be provided so as to surround only the inductors L1 and L2.

Figure 7:
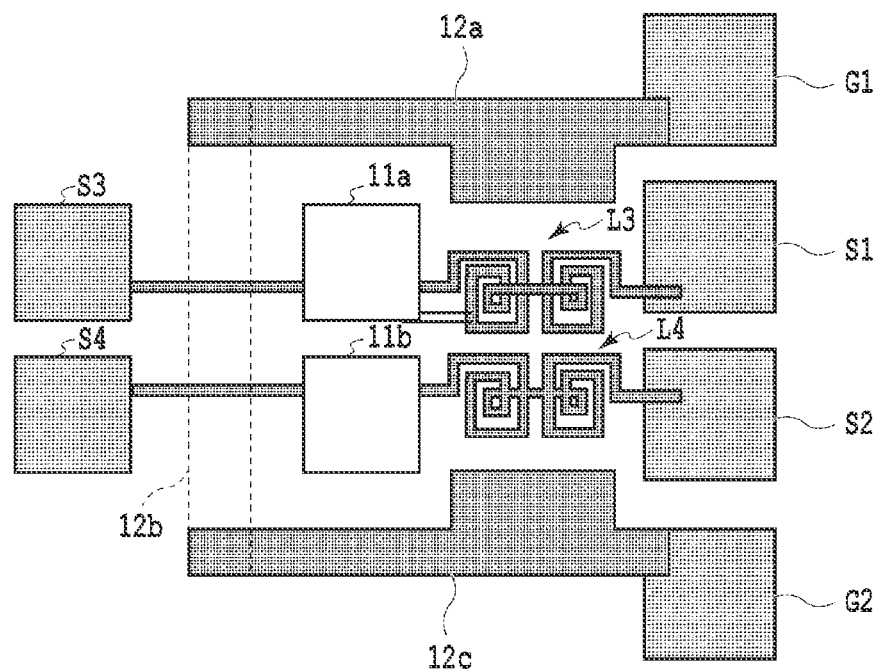
FIG. 7 is a diagram illustrating yet another configuration example of a pattern of signal/ground wiring and an inductor.
Figure 8:
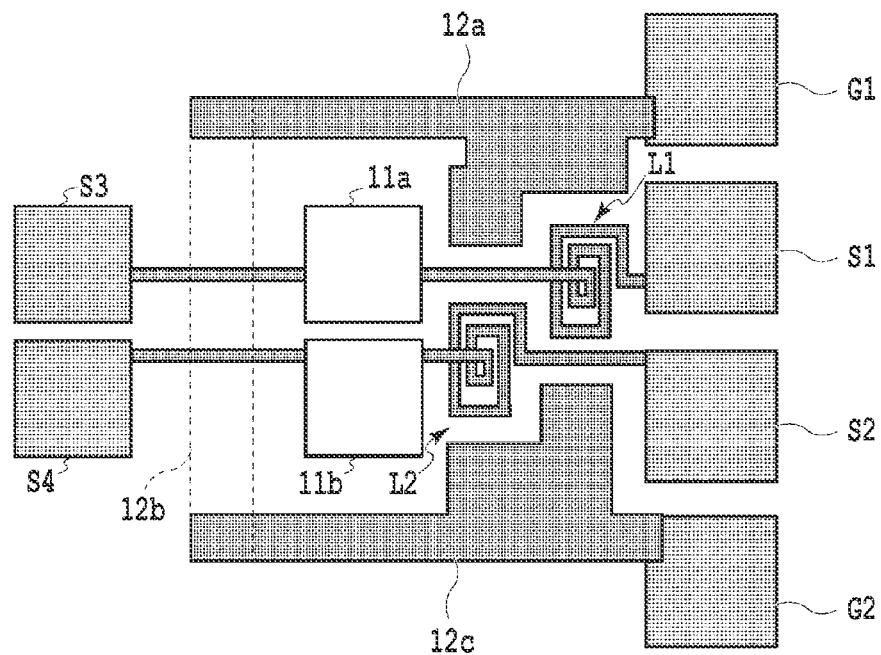
FIG. 8 is a diagram illustrating still yet another configuration example of a pattern of signal/ground wiring and an inductor.

Further, the inductors L1 and L2 illustrated in FIG. 5 may be replaced with two consecutive inductors L3 and L4 connected to the PDs 11a and 11b respectively as illustrated in FIG. 7. Furthermore, the inductors L1 and L2 are provided not equally distant but may be staggered with respect to the PDs 11a and 11b respectively as illustrated in FIG. 8.

Still furthermore, the ground wiring 12 is preferably provided up to the vicinity of the inductors L1 and L2 (L3 and L4).

The TIA-IC 20 includes signal terminals T1 and T2 for electrically connecting to the optical semiconductor 10; and signal output terminals T3 and T4 for connecting to the substrate 100. The TIA 21 is provided between the signal terminals T1 and T2 and the signal output terminals T3 and T4.

The optical semiconductor 10 and the TIA-IC 20 are flip-chip connected to the substrate 100 as the sub-package. The substrate 100 includes wirings (unillustrated) for electrically connecting between the signal terminals S1 and S2 of the optical semiconductor 10 and the signal terminals T1 and T2 of the TIA-IC 20. In other words, the optical semiconductor 10 and the TIA-IC 20 are electrically connected to each other via the substrate 100.

Next, the operation of the optical receiver illustrated in FIGS. 3 and 4 will be described. In the optical receiver of the present embodiment, the optical circuit 70 combines local light and an optical signal with appropriate phases to generate a differential optical signal, and the generated differential optical signal is incident on the photodiode (PD). The photodiode photoelectrically converts the differential optical signal and inputs it to the TIA-IC 20.

The inductors L1 and L2 are formed between the PDs 11a and 11b and the TIA 21 on the optical semiconductor 10. The inductors L1 and L2 extend the band by imparting peaking characteristics to frequency characteristics. Particularly in the flip-chip configuration illustrated in present embodiment, an inductance component may be insufficient and the band may deteriorate compared to the bonding configuration, and thus it is effective to add an inductor to extend the band in this way.

Further, the pair of inductors L1 and L2 has the same winding direction, so that electromagnetic waves leaking from the signal line are canceled by each other.

In the optical communication device of the present embodiment, the portion corresponding to the inductors L1 and L2 and the photodiodes 11a and 11b, namely, a set of differential lines of each channel are surrounded by the ground wiring 12. When the inductors L1 and L2 are added, the band can be expected to be widened, but the area occupied by the signal line becomes wider, thus causing signal interference with other received channels or signal interference with the transmitter in the case of a transceiver, but the interference signals can be shielded.

Effective shielding can be implemented with a smaller area by collectively surrounding the differential lines by ground than by individually surrounding them. Further, the inductors L1 and L2 susceptible to external effects can be effectively shielded by providing the ground wiring 12 as close to the inductors L1 and L2 as possible.

In the examples illustrated in FIGS. 4 and 5, the PDs 11a and 11b, which are optical devices, and the inductors L1 and L2 are collectively surrounded by ground. As illustrated in FIG. 6, however, distant interference in the channel may also be shielded by shielding only the inductors L1 and L2, thereby preventing unintended signal waveform deterioration.

Further, as illustrated in FIG. 7, a plurality of small inductors may be connected in series to form inductor connection portions L3 and L4, thereby suppressing external coupling, which becomes stronger as the area increases.

Alternatively, as illustrated in FIG. 8, the inductors L1 and L2 of the differential line may be staggered in the traveling direction of propagating differential signals, thereby avoiding an increase in coupling to adjacent channels, which is caused by increased lateral distance.

The ground terminals G1 and G2 and the power terminals S1 and S2 may be disposed at a position away from the vicinity of the PDs 11a and 11b so as to prevent the band from being deteriorated due to reduction in the impedance of the signal line.

REFERENCE SIGNS LIST 100 substrate
10 optical semiconductor
11a, 11b PD
S1, S2 signal terminal
S3, S4 power terminal
L1, L2 inductor
L3, L4 inductor connection portion
12a, 12b, 12c, 12d(12) ground wiring
G1, G2 ground terminal
20 TIA-IC
21 TIA
T1, T2 signal terminal
T3, T4 signal output terminal

The invention claimed is:

1. An optical communication device comprising a sub-package as a subassembly in each of a plurality of signal channels, the sub-package including a substrate on which an optical semiconductor and an IC are flip-chip connected, the optical semiconductor including a pair of photodiodes receiving a differential optical signal and outputting a differential current signal, the IC including a transimpedance amplifier converting the differential current signal from the optical semiconductor to a voltage signal, wherein
the optical semiconductor has a pair of inductors formed for each of the pair of photodiodes and a ground wiring formed so as to surround the formed pair of inductors.

2. The optical communication device according to claim 1, wherein the pair of inductors is formed in a spiral shape or a meander shape, and has the same winding direction.

3. The optical communication device according to claim 2, wherein each of the pair of inductors is disposed by connecting a plurality of inductor portions in series.

4. The optical communication device according to claim 2, wherein the pair of inductors is disposed in a staggered manner in a traveling direction of the differential current signal.

5. The optical communication device according to claim 2, wherein the ground wiring is formed so as to also surround the pair of photodiodes of the same signal channel.

6. The optical communication device according to claim 1, wherein each of the pair of inductors is disposed by connecting a plurality of inductor portions in series.

7. The optical communication device according to claim 6, wherein the ground wiring is formed so as to also surround the pair of photodiodes of the same signal channel.

8. The optical communication device according to claim 1, wherein the pair of inductors is disposed in a staggered manner in a traveling direction of the differential current signal.

9. The optical communication device according to claim 8, wherein the ground wiring is formed so as to also surround the pair of photodiodes of the same signal channel.

10. The optical communication device claim 1, wherein the ground wiring is formed so as to also surround the pair of photodiodes of the same signal channel.

* * * * *